United States Patent
Zuckerman (10) Patent No.: US 10,505,063 B1
(45) Date of Patent: Dec. 10, 2019

(54) GRAPHENE AND HEXAGONAL BORON NITRIDE VAN DER WAALS HETEROSTRUCTURED SOLAR ENERGY PROCESSING UNIT (SPU)

(71) Applicant: Mathew M. Zuckerman, Carbondale, CO (US)

(72) Inventor: Mathew M. Zuckerman, Carbondale, CO (US)

( * ) Notice: Subject to any disclaimer, the term of this patent is extended or adjusted under 35 U.S.C. 154(b) by 0 days.

(21) Appl. No.: 16/501,701

(22) Filed: May 24, 2019

(51) Int. Cl.
| | |
|---|---|
| *H01L 31/074* | (2012.01) |
| *H01L 31/0725* | (2012.01) |
| *H01L 31/0224* | (2006.01) |
| *H01L 31/0336* | (2006.01) |

(52) U.S. Cl.
CPC .... *H01L 31/074* (2013.01); *H01L 31/022425* (2013.01); *H01L 31/0336* (2013.01); *H01L 31/0725* (2013.01)

(58) Field of Classification Search
CPC ..................................................... H01L 31/074
See application file for complete search history.

(56) References Cited

U.S. PATENT DOCUMENTS

| | | | | |
|---|---|---|---|---|
| 2010/0218801 A1* | 9/2010 | Sung | ....................... | B82Y 30/00 136/244 |
| 2011/0089403 A1* | 4/2011 | Woo | ....................... | B82Y 10/00 257/29 |
| 2013/0140526 A1* | 6/2013 | Kim | ....................... | C01B 21/064 257/29 |
| 2013/0292685 A1* | 11/2013 | Jiang | ................... | H01L 31/0304 257/76 |
| 2014/0008611 A1* | 1/2014 | Geim | ................ | H01L 21/02527 257/14 |

(Continued)

OTHER PUBLICATIONS

Wang et al., "One-Dimensional Electrical Contact to a Two-Dimensional Material", Science, vol. 342, All Pages. (Year: 2013).*

(Continued)

*Primary Examiner* — Daniel P Malley, Jr.

(57) ABSTRACT

A Solar Processing Unit (SPU) for the conversion of solar energy to electric power comprising:
a heterostructure of sheets of two (2)-dimensional materials;
wherein the heterostructure is utilized to produce, in the third ($3^{rd}$) dimension, a crystalline structure wherein elemental Boron (B) and elemental Nitrogen (N), contained in sheets of hexagonal Boron Nitride (hBN), are located as bookends to one or more Cs, contained in sheet or sheets of Graphene in between;
wherein each absorbed photon, or part thereof, produces Multi-Excitation Generation wherein more than one electron is generated; and
wherein the SPU produces a spin motion of the Boron atoms, in one rotation, and the Nitrogen atoms, in the opposite rotation, in hBN around its on axis by placing an external fixed magnetic field located perpendicular to the sheet of hBN and a second orthogonal magnetic paired to the strength of the fixed magnetic field and tuned to the resonant magnetic frequency of Nitrogen-15 followed by Boron-11 that combine to achieve the spin required for enhanced photonic absorption.

6 Claims, 6 Drawing Sheets

(56) References Cited

U.S. PATENT DOCUMENTS

| | | | | |
|---|---|---|---|---|
| 2015/0083206 A1* | 3/2015 | Novoselov | ............. | B82Y 30/00 |
| | | | | 136/256 |
| 2018/0158913 A1* | 6/2018 | Withers | ................ | H01L 29/267 |
| 2018/0301579 A1* | 10/2018 | Lashmore | ............... | C01B 35/14 |

OTHER PUBLICATIONS

Shi et al., "Enhanced Near-Field Thermal Radiation Based on Multilayer Graphene-hBN Heterostructures", ACS Photonics, All Pages. (Year: 2017).*

* cited by examiner

Two Dimensions Ideal

$B_2C_2N_2$

Two Dimensional Achievable

| Element | | EN | AN | DF vs N |
|---|---|---|---|---|
| Boron | B | 2.04 | 5 | 1.00 |

| Element | | EN | AN | DF vs N |
|---|---|---|---|---|
| Lithium | Li | 0.98 | 3 | 2.06 |
| Titanium | Ti | 1.54 | 22 | 1.50 |
| Alumnium | Al | 1.61 | 12 | 1.43 |
| Zinc | Zn | 1.65 | 30 | 1.39 |
| Gallium | Ga | 1.81 | 31 | 1.23 |
| Copper | Cu | 1.90 | 29 | 1.14 |
| Nickel | Ni | 1.91 | 28 | 1.13 |
| Silver | Ag | 1.93 | 47 | 1.11 |

| Element | | EN | AN | DF vs B |
|---|---|---|---|---|
| Nitrogen | N | 3.04 | 7 | 1.00 |

| Element | | EN | AN | DF vs B |
|---|---|---|---|---|
| Fluorine | F | 4.00 | 9 | 1.96 |
| Oxygen | O | 3.50 | 8 | 1.46 |
| Chlorine | Cl | 3.00 | 17 | 0.96 |
| Gold | Au | 2.54 | 79 | 0.50 |
| Lead | Pb | 2.33 | 82 | 0.29 |
| Platium | Pt | 2.28 | 78 | 0.24 |
| Palladium | Pd | 2.20 | 46 | 0.16 |
| Mercury | Hg | 2.00 | 80 | 0.04 |

EN = ElectroNegativity

AN = Atomic Number

DF vs B= Difference in Electronegativity vs Boron

DF vs N = Electronegativity vs Nitrogen

|  | Spin | Atomic Number | Mass Number | Relative Abundance, % | Earth's Crust, ppm | Atmosphere, % by Vol. |
|---|---|---|---|---|---|---|
| Nitrogen, N | 1 | 7 | 14 | 99.63 | X | 78.1 |
|  | 1/2 |  | 15 | 0.37 |  |  |
| Boron, B | 3 | 5 | 10 | 19.89 | 10 | X |
|  | 3/2 |  | 11 | 80.2 |  |  |

|  |  | Sign | Magnetic Moment | Delta In Moments |
|---|---|---|---|---|
| Nitrogen | N-14 | Positive | 0.40376 |  |
| Nitrogen | N-15 | Negative | 0.28318 | 0.68694 |
| Boron | B-10 | Positive | 1.80064 |  |
| Boron | B-11 | Positive | 2.68864 | 0.88800 |

FIG. 5

| | Resonant Nuclear Magnetic Frequencies (RNMF), MHz @ Strong Magnetic Field, Kilo Gauss | | | | | | | |
|---|---|---|---|---|---|---|---|---|
| | Symbol | 10.000 | 14.092 | 21.139 | 23.487 | 51.567 | 93.950 | 140.925 | 223.131 |
| Carbon | C-13 | 10.705 | 15.087 | 22.630 | 25.144 | 55.317 | 100.574 | 150.866 | 2,388.515 |
| Nitrogen | N-14 | 3.076 | 4.334 | 6.501 | 7.224 | 15.924 | 28.910 | 43.910 | 68.557 |
| Nitrogen | N-15 | 4.314 | 6.080 | 9.120 | 10.133 | 22.293 | 40.531 | 60.796 | 96.260 |
| Oxygen | O-17 | 5.772 | 8.134 | 12.201 | 13.557 | 29.825 | 54.181 | 81.319 | 128.580 |

Note: A Magnatron tuned to the Resonant Nuclear Magnetic Frequency of the Isotope creates a spin.

FIG. 6

GRAPHENE AND HEXAGONAL BORON NITRIDE VAN DER WAALS HETEROSTRUCTURED SOLAR ENERGY PROCESSING UNIT (SPU)

FIELD OF INVENTION

The present invention relates generally to the capture of solar energy and conversion of that solar energy into electrical power. More particularly, disclosed herein are solar energy conversion systems and methods for improved percentage of incident solar energy.

BACKGROUND OF INVENTION

Figure 1:
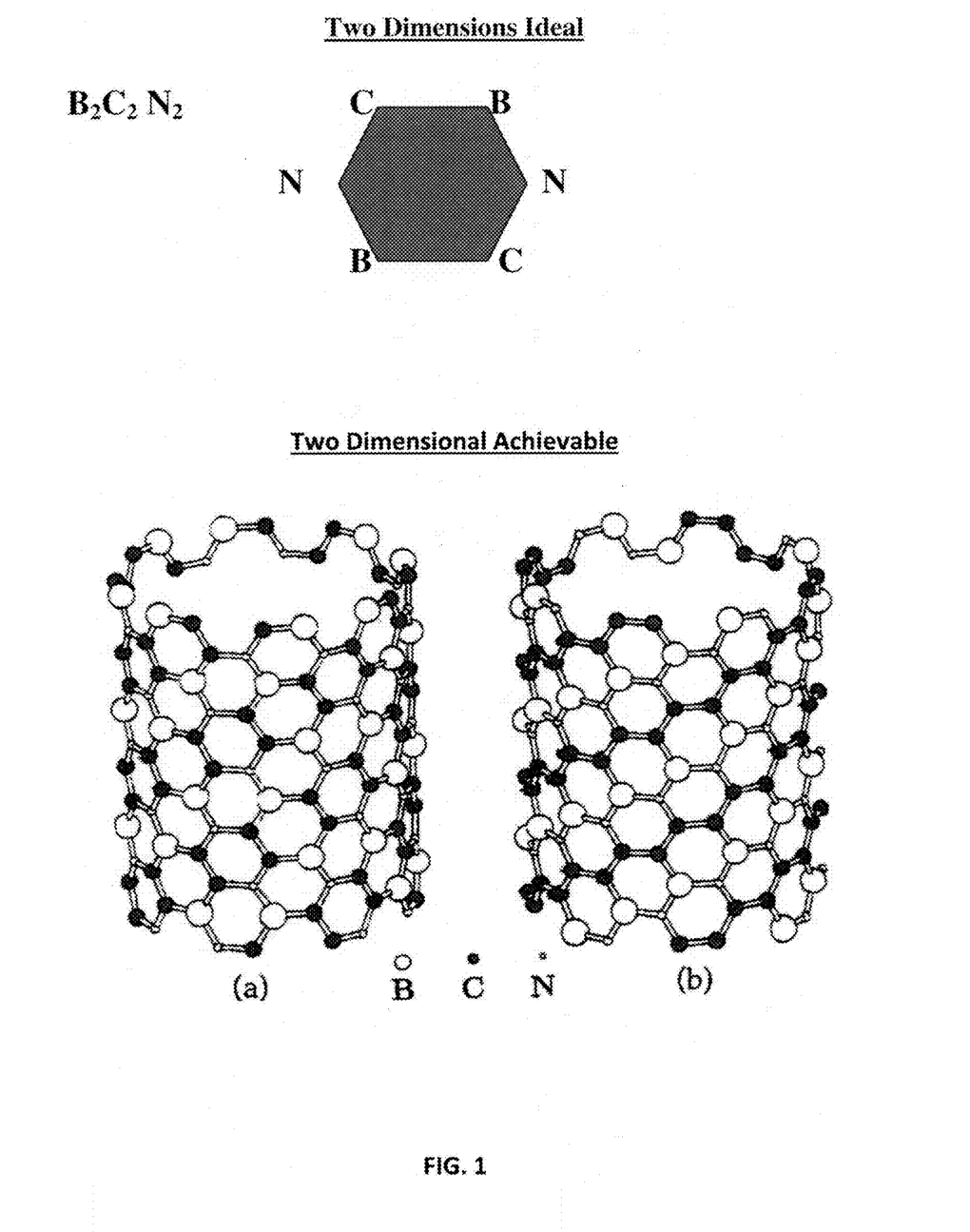
FIG. 1 shows two-dimensional ideal and achievable two-dimensional hexagonal crystalline structure of the $B_2C_2N_2$ crystalline structure.

The holy grail for Solar Processing Units is to have the elements of Boron (B), Carbon (C), and Nitrogen (N) occupy the two-dimensional hexagonal crystalline structure of a $B_2C_2N_2$ formula with sequences where B and N are located as bookends with one or more C in between. The ideal crystalline two-dimensional structure is shown in FIG. 1. Also shown in this FIG. 1 is the output of mathematical modeling based on quantum assumptions. Two stable isomers of $B_2C_2N_2$ are predicted to exist. However, nowhere in the isomers does the requisite pattern, B and N as bookends with one or more Cs in between for the two-dimensional hexagonal crystalline structure, appear.

It is generally accepted that Einstein's principals of the forces of mass apply in outer space and Newton's Laws apply on Earth. However, Einstein's principals of the forces of mass also apply at the other end of the mass continuum for elements and crystalline structures. The gravitational attraction of Earth's Moon to Earth is not unlike the van der Waal attraction of the nuclei of elements.

SUMMARY OF THE INVENTION

With recognition of the foregoing, including the long-standing needs in the photovoltaic industry, the present invention was founded on the fundamental object of providing Solar Processing Units (SPUs) and a panel, such as but not limited to a panel with nominal dimensions of three (3) feet by six (6) feet containing two (2) SPUs, that exhibits greater solar energy conversion efficiencies thereby to produce increased Watts of electrical power per dollar of capital investment and/or that occupies a decreased foot print.

In embodiments, an object of this invention is to incorporate in the SPU a heterostructure of sheets of two (2)- dimensional materials that are utilized to produce, in the third ($3^{rd}$) dimensional z-plane, the desired crystalline structure where B and N are located are bookends with one or more Cs in between.

In embodiments, a further object of this invention is to incorporate in the SPU, a bilayer of Graphene, or multiples thereof, to capture the visible light portion of the solar spectrum.

In embodiments, a still further object of this invention is to incorporate in the SPU, Hexagonal Boron Nitride (hBN) monolayers, or multiples thereof, above and below the bilayer of Graphene, to dominantly capture ultraviolet and the infrared portions of the solar spectrum above the bilayer of Graphene and below the bilayer of Graphene, respectively.

In embodiments, an object of this invention is to produce a heterostructure wherein each absorbed photon, or part thereof, produces Multi-Excitation Generation wherein more that one electron is generated for each absorbed photon.

In embodiments, a further object of this invention is to implant by electro-chemical means strongly electronegative elements, such as a Fluorine, to incorporate materials that electrically offset the electropositive Boron in hBN to create a n-Type semiconductor.

In embodiments, a still further object of this invention is to implant by electro-chemical means strongly electropositive elements, such as Lithium, to incorporate materials that electrically offset the electronegative Nitrogen in hBN to create a p-Type semiconductor.

In embodiments, a further object of this invention is to apply the n-Type and p-Type doping to the outer surface of the hBN layers to create across the depth of the hBN: first, an insulating zone adjacent to the surface facing bilayer Graphene; then, a semi-conductor zone that is either a n-Type or a p-Type semiconductor; and, finally, a conductive layer that can be connected to form a positive electrode at the hBN layer nearest the solar illumination and a negative electrode at the hBN layer farthest from the solar illumination.

In embodiments, a still further object of this invention is to employ Boron in the hBN sheets that constitutes almost pure Boron-11, atomic weight 11, with a magnetic moment of positive 2.68864 kg-second-amps and Nitrogen in the hBN sheets that constitutes almost pure Nitrogen-15, atomic weight 15, with a magnetic moment of negative 0.28318 kg-second-amps.

In embodiments, an objective of this invention is to produce a spin motion of the Boron atoms, in one rotation, and the Nitrogen atoms, in the opposite rotation, in hBN around its on axis by placing an external fixed magnetic field located perpendicular to the sheet of hBN and a second located orthogonal magnetic paired to the strength of the fixed magnetic field and tuned to the resonant magnetic frequency of Nitrogen-15 followed by Boron-11 that combine to achieve the requisite spin for enhanced photonic absorption.

BRIEF DESCRIPTION OF THE DRAWINGS

To further clarify the above and other advantages and features of the present invention, a more particular description of the invention will be rendered by references to specific embodiments thereof, which are illustrated in the appended drawings. It will be understood that these drawings depict only embodiments of the broader invention disclosed herein and are, therefore, not to be limiting of its scope.

The invention will be described and explained with additional specificity and detail through reference to the accompanying drawings in which.

DETAILED DESCRIPTION OF PREFERRED EMBODIMENTS

The systems and methods for the conversion of solar energy to electric power are subject to a wide variety of embodiments. However, to ensure that on skilled in the art will be able to understand and, in appropriate cases, practice the present invention, certain preferred embodiments of the broader invention revealed herein are described below and shown in the accompanying drawing figures.

The pi bonds between Boron and Nitrogen in hBN are at least an order of magnitude greater than the pi bonds between Carbons in the hexagonal structure of Carbon. Therefore, substitution of Boron for Carbon or Nitrogen for Carbon are possible for Graphene but not possible for hBN. However, as shown in FIG. 1, the requisite sequence of B, C, and N cannot be achieved in two (2)-Dimensions. Three (3) Dimensional Heterostructure is employed in the present invention by stacking monolayers, or growing the layers in combination, to achieve the requisite sequence of B, C, and N.

The van der Waals forces between B, C, and N that are present in the three (3) Dimensional structure substitute for the pi forces in the two (2) Dimensional structure. These forces are mass-dependent. In the present invention, the mass of B, C, and N are similar with the value of the mass of Carbon only 16.6% greater than the mass of Nitrogen and 11.7% less than the mass of Boron.

Figure 2:
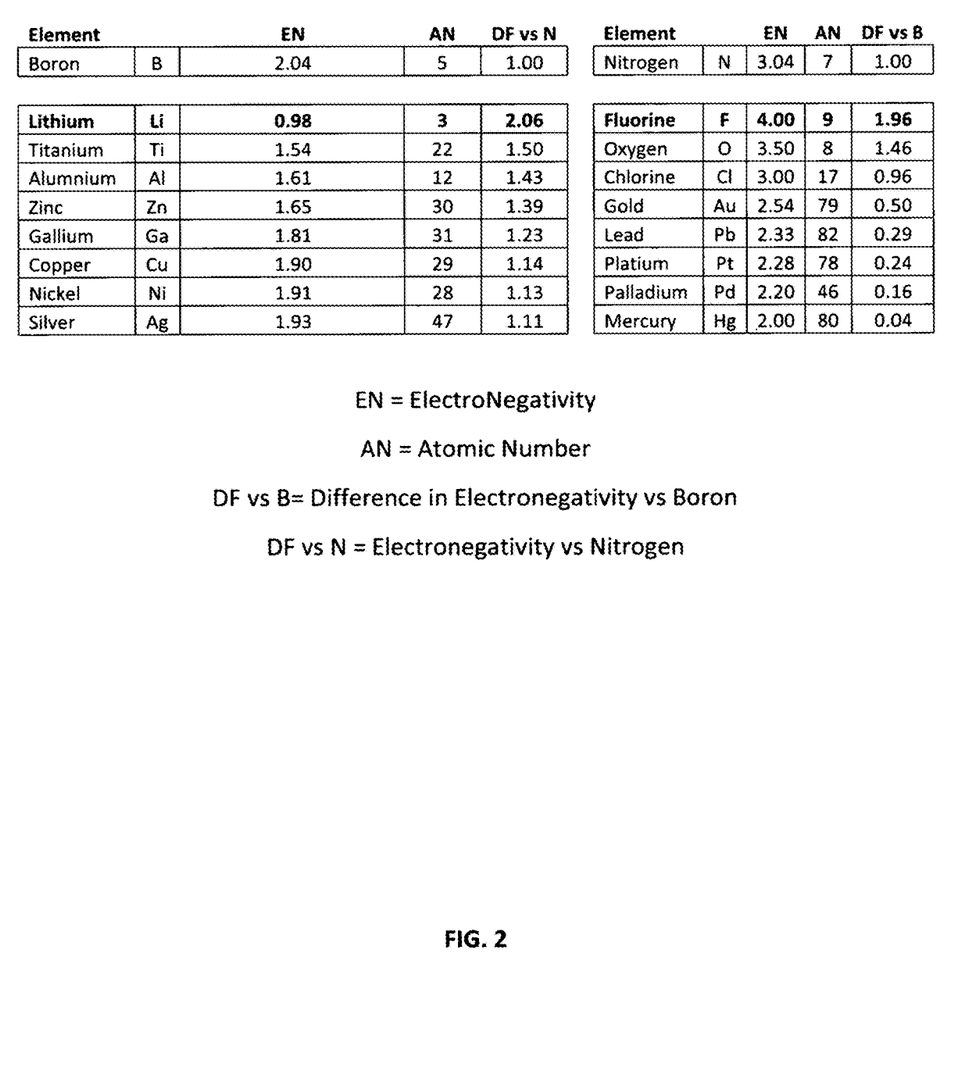
FIG. 2 sets forth the electronegativity of a group of elements from which can be selected one or more dopants for electrochemical attachment to Boron and Nitrogen.

To move electrons that are produced from the absorption of photons in the simplest embodiment of the SPU, monolayer of Graphene with hBN bookends above and below, the hBN layer closest to the Sun must be an n-Type semiconductor, and the hBN layer farthest from the Sun must be a p-Type semiconductor. This is accomplished by electrochemical implanting the hBN with an element that has a high electronegativity to lessen the electronegativity of the Boron, to produce an n-Type semiconductor and implant the hBN with an element that has a low electronegativity, to decrease the electronegativity of the Nitrogen, to produce a p-Type semiconductor. The electronegativity of a group of elements from which can be selected one or more dopants for electrochemical attachment to Boron and Nitrogen is shown in FIG. 2.

The SPU will function when there is a difference in electronegativity between the n-Type bookend and the p-Type bookend. However, the performance of the SPU is enhanced in proportion to the difference in electronegativity between the hBN bookends. From the electronegativity data in FIG. 2, it can be determined that the maximum difference in electronegativity occurs when the Boron in hBN is electrochemically implanted with Fluorine to produce n-Type semiconductors and the Nitrogen in hBN is electrochemically implanted with Lithium to produce p-Type semiconductors. Although several methods of ion implantation are available to accomplish the task, a preferred method of ion implantation is by Ionphoretic that finds use in delivery of ions into substrates.

Figure 3:
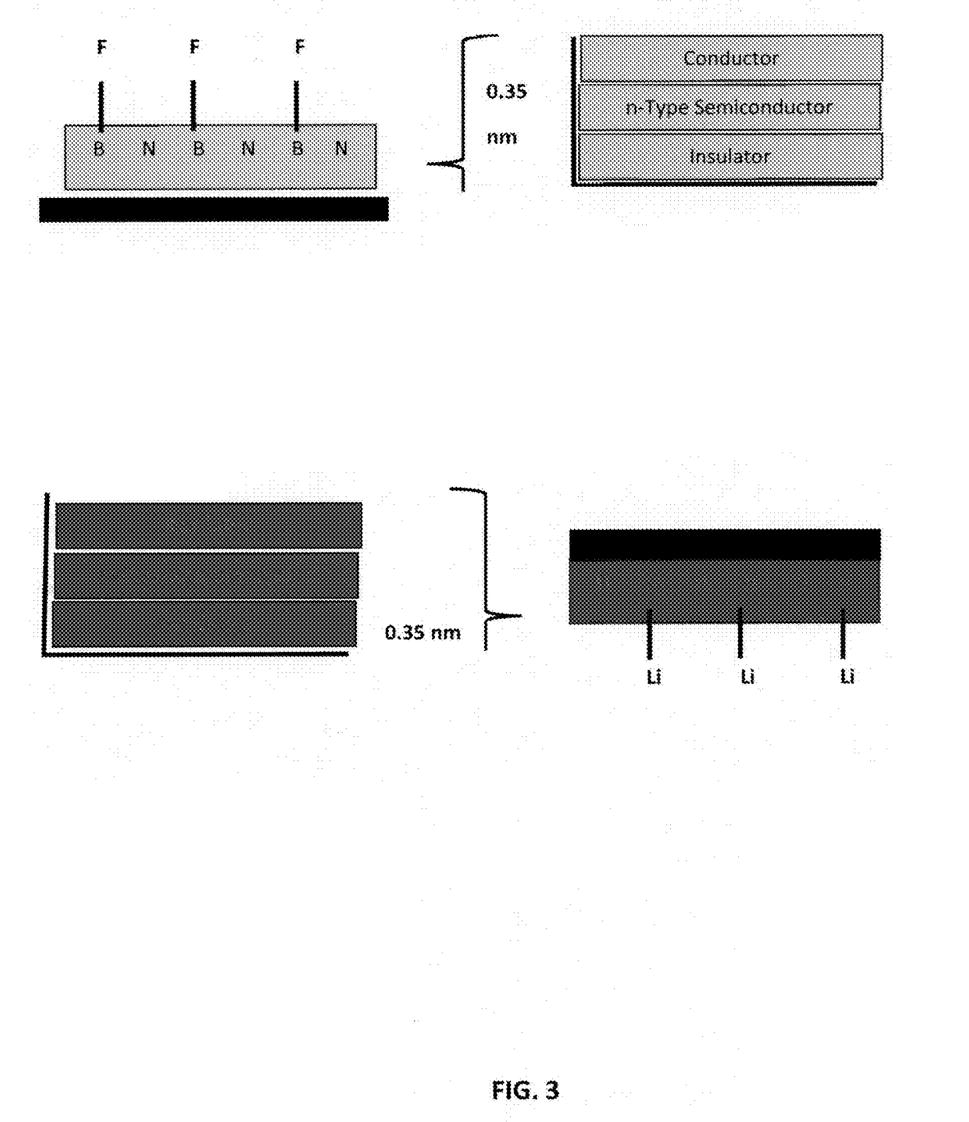
FIG. 3 depicts the implant of strongly electronegative and electropositive elements in hBN to create n-Type and p-Type semiconductor.

The implant of strongly electronegative and electropositive elements in Hexagonal Boron Nitride (hBN) to create n-Type and p-Type semiconductors is depicted in FIG. 3. Ionphoretic implantation of Florine is directed from the top surface of the hBN to create a tri-layer doping structure across the 0.35 nm depth, first with a conductive zone, that can be attached by a positive (+) electrode to the outside world, followed by an n-Type semiconductor zone, and finally an insulator zone. Ionphoretic implantation of Lithium is directed from the bottom surface of the lower hBN to create a tri-layer doping structure across the 0.35 nm, first with an insulator zone, followed by a p-Type semiconductor zone, and finally by a conductive zone, that can be attached by a negative (−) electrode to the outside world.

Figure 4:
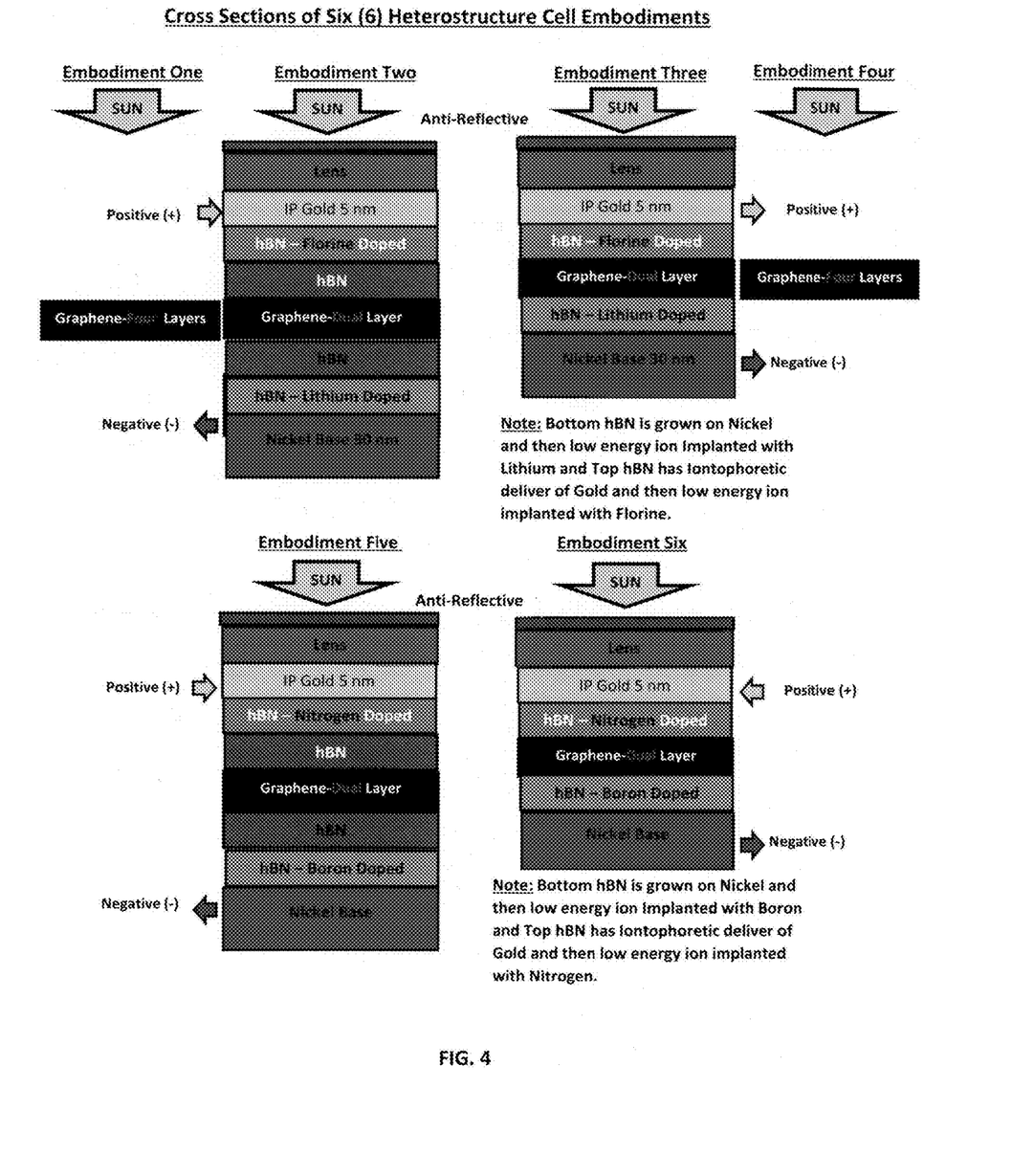
FIG. 4 shows a Cross Section of a Heterostructure for a preferred embodiment of the present invention.

A cross-section of a Heterostructure for a preferred embodiment of the present invention is shown in FIG. 4. The core element of the "Stack" is two layers of Graphene. One preferred embodiment involves growing two (2) layers of Graphene to have the layers in alignment. In an alternative embodiment, two (2) monolayers of Graphene are placed on top of each other. This dual layer Graphene is the primary absorber of the visible light portion of the solar spectrum. The bookends to the Graphene is a layer of hBN above and another below. The hBN layer closest to the solar source is the location where the Ultra-Violet portion of the spectrum is absorbed, and the hBN layer further from the solar source is the location where the Infrared portion of the spectrum is absorbed. The tri-layer doping structure across the 0.35 nm is produced by Ionphoretic implantation of Lithium into the hBN layer closest to the solar source and implantation of Fluorine into the hBN layer furthest from the solar source. The path of the solar spectrum energy is first through a lens, with an anti-reflective coating, then through the "Stack" and finally to a reflective coating on the base so that the un-absorbed photons can pass upward through the "Stack" to have additional chances of absorption.

Figure 5:
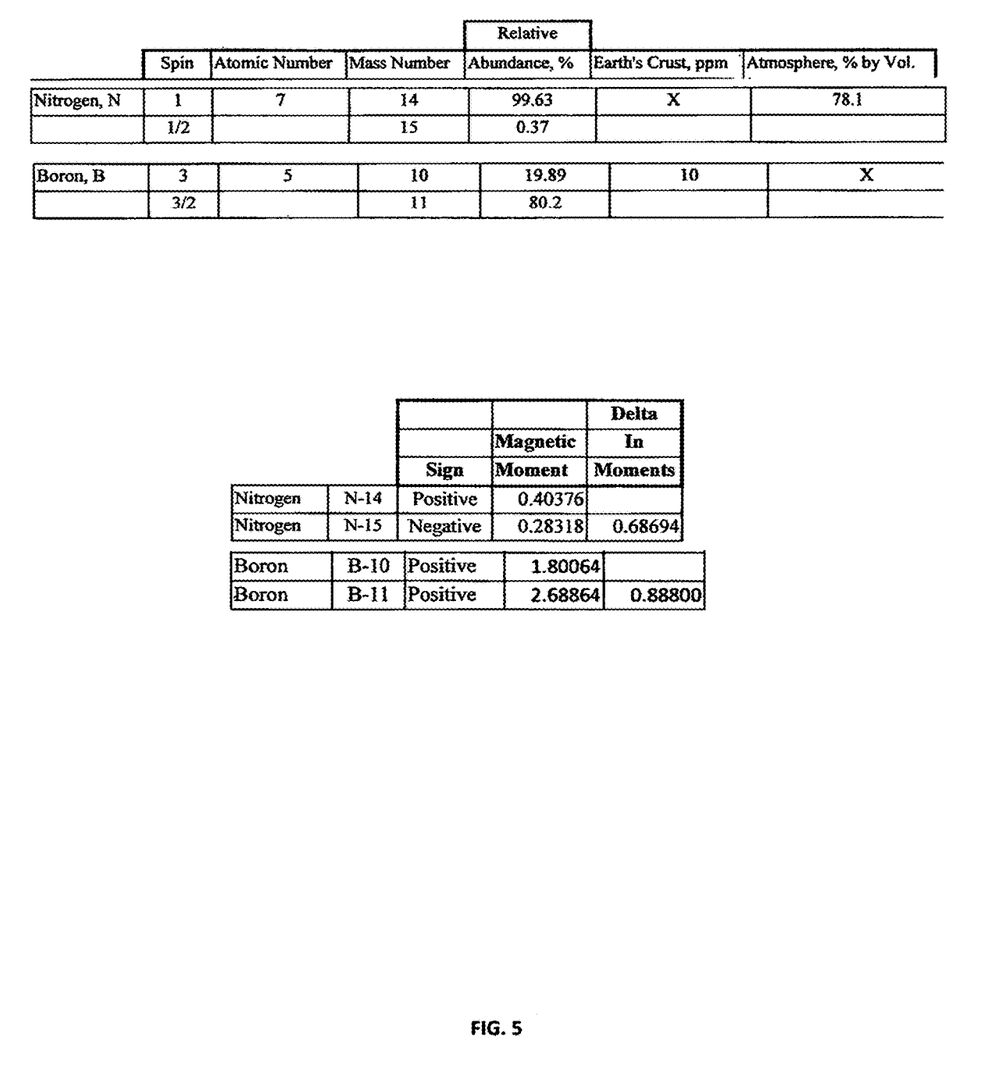
FIG. 5 sets forth characteristics of the isotopes of Nitrogen and Boron and their Magnet Moments.

There are two (2) isotopes of each of Nitrogen and Boron. The heavier isotopes of each are the preferred forms for the invention for these forms do not have the same number of neutrons and protons in their nucleus. These imbalances result in magnetic moments for their isotopes. The isotopes of Nitrogen and Boron and their Magnet Moments are shown in FIG. 5. The magnetic moment of Nitrogen-15, atomic weight 15, is negative 0.28318 kg-second-amps. The magnetic moment of Boron-11, atomic weight 11, is positive 2.688864 kg-seconds-amps. Placement of an hBN sheet fabricated from these heavier isotopes of Boron and Nitrogen in requisite magnetic fields will result in the spin of the Boron-11 in one rotation and the Nitrogen-11 in a the opposite rotation direction. The spin of the elements results in enhanced absorption of the Ultra-Violet and Infrared portions of the solar spectrum by the "Stack".

Figure 6:
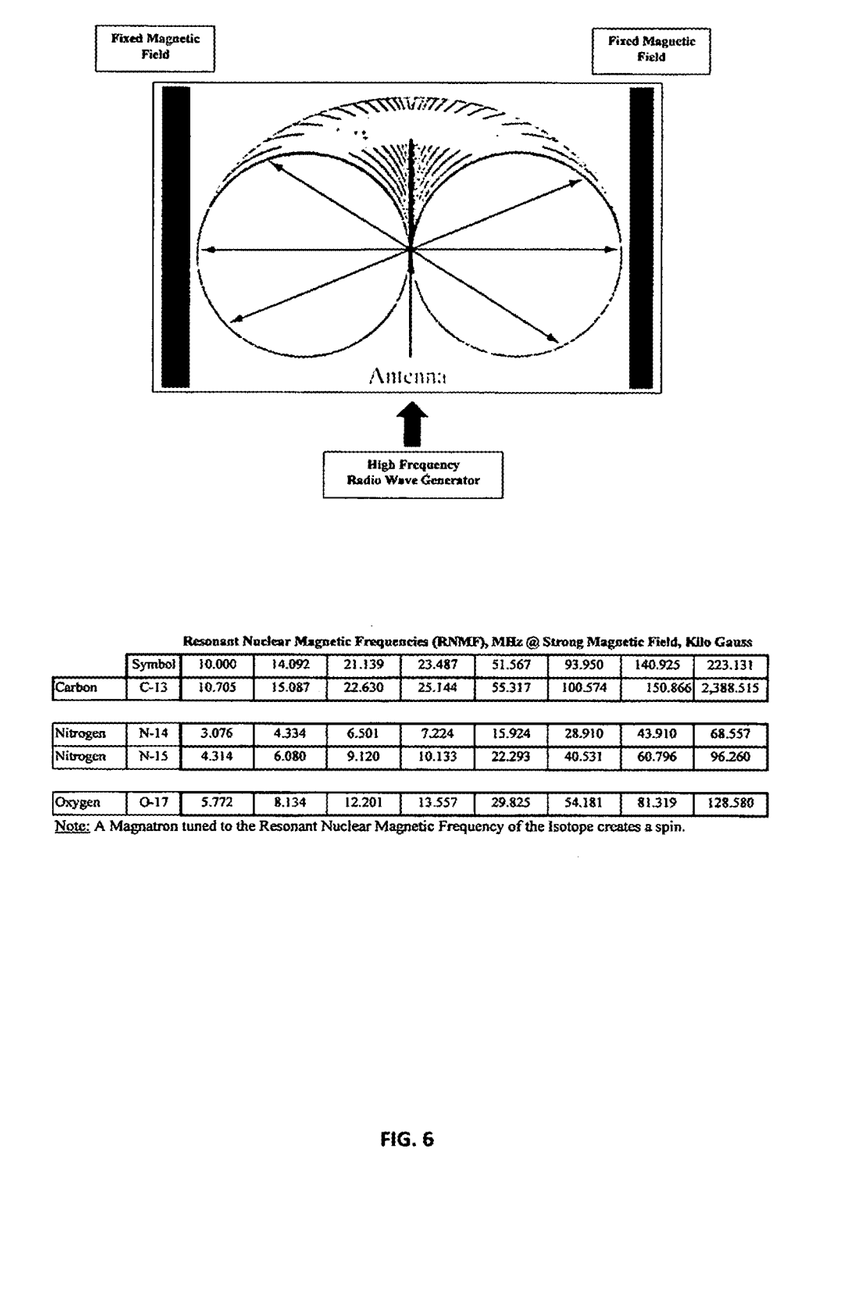
FIG. 6 depicts the arrangement of orthogonal magnetic fields and the Fixed Magnetic Field and Resonant Nuclear Magnetic Frequencies pairs required to spin the nucleus of several elements.

The arrangement of orthogonal magnetic fields and the Fixed Magnetic Field and Resonant Nuclear Magnetic Frequencies pairs required to spin the nucleus of several element is shown in FIG. 6. By placing the hBN, produced from the heavy isotopes of Boron and Nitrogen, in the geometric configuration shown in FIG. 6 and adopting a sequence that alternates the radiofrequencies that produce nuclear magnetic resonance for Nitrogen-15 followed by Boron-11 that combine to achieve the requisite spin, enhanced photonic absorption is achieved.

With certain details and embodiments of the present invention for Systems and Methods for the conversion of Solar Energy to Electric Power disclosed, it will be appreciated by one skilled in the art that numerous changes and additions could be made thereto without deviating from the spirit or scope of the present invention. This is particularly true when one bears in mind that the presented preferred embodiments merely exemplify the broader invention revealed herein. Accordingly, it will be clear that those with major features in mind could craft embodiments that incorporate those major features while not incorporating all of the features included in the preferred embodiments.

Therefore, the claims that will ultimately be employed to protect this invention will define the scope of protection to be afforded to the inventor. Those claims shall be deemed to include equivalent constructions insofar as they do not depart from the spirit and the scope of the invention. It must be further noted that a plurality of the following claims may express certain elements as means of performing a specific function, at times without the recital of structure of material. As the law demands, any such claim shall be construed to cover not only the corresponding structure and material expressly described in this specification but also the equivalents thereof.

What is claimed as deserving of Letters Patent is:

1. A Solar Processing Unit (SPU) for the conversion of solar energy to electric power comprising:
    a nickel base,
    a p-type layer of hexagonal boron nitride deposited on the nickel base,
    a layer of graphene deposited on the p-type layer of hexagonal boron nitride,
    a n-type layer of hexagonal boron nitride deposited on the layer of graphene,
    wherein the p-type and n-type layers of hexagonal boron nitride sandwich the layer of graphene forming a heterostructure,
    wherein the n-type layer of hexagonal boron nitride is closer to a surface struck by sunlight than the p-type layer of hexagonal boron nitride, and
    wherein an insulating layer of hexagonal boron nitride is interjected between the p-type layer of hexagonal boron nitride and the layer of graphene, and another insulating layer of hexagonal boron nitride is interjected between the n-type layer of hexagonal boron nitride and the layer of graphene.

2. The Solar Processing Unit (SPU) of claim 1, wherein the p-type layer of hexagonal boron nitride is doped with lithium.

3. The Solar Processing Unit (SPU) of claim 1, wherein the n-type layer of hexagonal boron nitride is doped with fluorine.

4. The Solar Processing Unit (SPU) of claim 1, wherein the nickel base connects to a negative terminal of the Solar Processing Unit.

5. The Solar Processing Unit (SPU) of claim 1, wherein the n-type layer of hexagonal boron nitride is implanted with gold to create a conductive layer that connects to a positive terminal of the Solar Processing Unit.

6. The Solar Processing Unit (SPU) of claim 1, wherein the layer of graphene is a bilayer of graphene.

* * * * *